United States Patent
Nakamura et al.

(10) Patent No.: US 7,604,013 B2
(45) Date of Patent: Oct. 20, 2009

(54) SUBSTRATE CLEANING METHOD AND DEVELOPING APPARATUS

(75) Inventors: Junji Nakamura, Koshi-Machi (JP); Kousuke Yoshihara, Koshi-Machi (JP); Kentaro Yamamura, Koshi-Machi (JP); Fumiko Iwao, Koshi-Machi (JP); Hirofumi Takeguchi, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 499 days.

(21) Appl. No.: 11/074,781

(22) Filed: Mar. 9, 2005

(65) Prior Publication Data

US 2006/0048792 A1 Mar. 9, 2006

(30) Foreign Application Priority Data

Sep. 9, 2004 (JP) ............................. 2004-262983

(51) Int. Cl.
*B08B 3/00* (2006.01)
(52) U.S. Cl. .................... 134/95.2; 134/95.3; 134/99.1; 134/102.1; 134/102.2; 134/147; 134/148; 134/153; 134/198; 134/902
(58) Field of Classification Search ............... 134/94.1, 134/95.1, 95.2, 95.3, 99.1, 100.1, 102.1, 134/102.2, 147, 148, 153, 198, 902; 118/690
See application file for complete search history.

(56) References Cited

U.S. PATENT DOCUMENTS 5,997,653 A 12/1999 Yamasaka (Continued)

FOREIGN PATENT DOCUMENTS

JP 10-340836 12/1998

(Continued)

*Primary Examiner*—Michael Barr
*Assistant Examiner*—Rita R Patel
(74) *Attorney, Agent, or Firm*—Oblon, Spivak, McClelland, Maier & Neustadt, L.L.P.

(57) ABSTRACT

A cleaning method highly effectively cleans a surface of a semiconductor wafer by removing a dissolution product, produced when a surface of a semiconductor wafer is processed by a developing process that develops an exposed film formed on the semiconductor wafer by wetting the exposed film with a developer, from the surface of the semiconductor wafer. A cleaning liquid is poured through a cleaning liquid pouring nozzle onto a central part of a rotating wafer processed by a developing process to spread the cleaning liquid in a film over the surface of the wafer. Then, the cleaning liquid pouring nozzle is shifted to create a dry area in a central part of the wafer and the wafer is rotated at 1500 rpm to expand the dry area. The cleaning liquid pouring nozzle is moved at a nozzle moving speed high enough to keep the cleaning liquid pouring position ahead of the margin of the dry area and pouring the cleaning liquid is stopped upon the arrival of the cleaning liquid pouring nozzle at a predetermined position at 80 mm from the center of the wafer or at 5 mm above toward the center of the wafer from the peripheral edge of the wafer. The cleaning liquid may be poured through another cleaning liquid pouring nozzle disposed beforehand at the predetermined position and pouring the cleaning liquid through the cleaning liquid pouring nozzle may be stopped immediately before the margin of the dry area reaches a part onto which the cleaning liquid is poured through the cleaning liquid pouring nozzle. Preferably, a gas is blown instantaneously against the central part of the wafer to form a core fore the dry area.

10 Claims, 10 Drawing Sheets

U.S. PATENT DOCUMENTS

| | | |
|---|---|---|
| 6,319,317 B1 | 11/2001 | Takamori |
| 6,371,667 B1 | 4/2002 | Kitano et al. |
| 6,491,764 B2 * | 12/2002 | Mertens et al. ............... 134/36 |
| 6,541,376 B2 | 4/2003 | Inada et al. |

FOREIGN PATENT DOCUMENTS

| | | |
|---|---|---|
| JP | 2001-053051 | 2/2001 |
| JP | 2001-104861 | 4/2001 |
| JP | 2001-284206 | 10/2001 |
| JP | 2002-57088 | 2/2002 |
| JP | 2004-335542 | 11/2004 |

* cited by examiner

SUBSTRATE CLEANING METHOD AND DEVELOPING APPARATUS

BACKGROUND OF THE INVENTION

1. Field of the Invention

The present invention relates to a method of cleaning surfaces of a substrate processed by a developing process which wets the surfaces of the substrate with a developer after exposure, and a developing apparatus for carrying out the method.

2. Description of the Related Art

A resist pattern forming process is one of semiconductor device fabricating processes. The resist pattern forming process spreads a photoresist over a surface of a semiconductor wafer (hereinafter, referred to simply as "wafer") in a photoresist film, exposes the photoresist film through a mask of a predetermined pattern, and develops the exposed photoresist film to form a resist pattern. Generally, this resist pattern forming process is carried out by a resist-applying-and-developing system formed by combining an exposure apparatus, and a developing apparatus capable of forming a resist film and of developing the exposed resist film.

A developing process included in a series of processes forms a resist pattern by wetting a surface coated with a resist film of a wafer with a developer and leaving the wetted wafer stationary for a predetermined time to remove soluble parts of the resist film. Then, the wafer is subjected to a cleaning process to remove a dissolution product produced by the dissolution of the resist, and the developer from the surface of the wafer. A spin cleaning method, namely, a conventional cleaning method, supplies a cleaning liquid onto a central part of the rotating wafer, and spreads the cleaning liquid by centrifugal force to wash out the dissolution product and the developer by the cleaning liquid. The spin cleaning method, however, is incapable of completely removing the dissolution product. Such an insufficient cleaning effect of the spin cleaning method is not a problem when the component lines of the resist pattern are wide. However, the possibility of the residual dissolution product producing development defects increases with decrease in the width of the component lines of the resist pattern. For example, the spin cleaning methods needs to continue a cleaning operation as long as 60 s, which is a principal factor causing the reduction of throughput. Cost reduction competition has been intensified in the semiconductor industry in recent years, the improvement of the throughput of semiconductor device fabricating processes is an urgent necessity. Since the resist pattern forming process has many steps, it is desired to reduce the process times of the steps to the shortest possible times. It is hardly possible to ensure perfect cleaning because, in some cases, the dissolution product cannot be completely removed even if the wafer is cleaned for a long cleaning time.

FIG. 13 is a typical view of assistance in explaining a spin cleaning method. A wafer W is held on a spin chuck 1, and the spin chuck 1 is rotated. Then, a cleaning liquid R is poured through a nozzle 11 onto a central part of the rotating wafer W. The cleaning liquid R spreads over the surface of the wafer W in a cleaning liquid film. It is considered that particles P of a dissolution product remain in the interface between the flowing cleaning liquid film of the cleaning liquid R and the surface of the wafer W. In another word, it is considered that the flowing cleaning liquid R is unable to wet the surface of a pattern formed on the wafer W satisfactorily or that flowing velocity of the cleaning liquid R in the interface is decreased by some cause.

A cleaning method disclosed in Patent document 1 pours a cleaning liquid onto a central part of a rectangular substrate being rotated at a low rotating speed on the order of 200 rpm, blows nitrogen gas against the surface of the substrate immediately after pouring the cleaning liquid onto the substrate. A liquid pouring position, onto which the cleaning liquid is poured, on the substrate and a gas blowing position, onto which nitrogen gas is blown, on the substrate are shifted simultaneously from the central part of the substrate toward a peripheral part of the same. A cleaning liquid pouring operation is stopped upon the shift of the liquid pouring position to a position on an inscribed circle tangent to the sides of the substrate.

When nitrogen gas is blown onto the gas flowing position behind the liquid pouring position onto which the cleaning liquid is poured as the liquid pouring position is shifted radially, the flow of the cleaning liquid is disturbed by the nitrogen gas, and particles separated from the surface of the wafer W are unable to flow together with the cleaning liquid and remain on the wafer W. Although this known cleaning method is more effective than the spin cleaning method, this known cleaning method has difficulty in exercising a high cleaning effect.

Patent document 1: JP-A 2002-57088, Paragraphs 0047 and 0049

SUMMARY OF THE INVENTION

The present invention has been made in view of such problems and it is therefore an object of the present invention to provide a cleaning method of cleaning the surface of a substrate processed by a developing process that develops an exposed film formed on the substrate by wetting the exposed film with a developer, capable of exercising a high cleaning effect and of accomplishing a cleaning process in a short time, and to provide a cleaning apparatus for carrying out the cleaning method.

A cleaning method of cleaning a surface of a substrate processed by a developing process that develops an exposed film formed on the substrate by wetting the exposed film with a developer includes the steps of: pouring a cleaning liquid onto a central part of the substrate held in a horizontal position on a substrate holding device rotating about a vertical axis; creating a dry area not wetted with the cleaning liquid in a central part of the substrate by stopping pouring the cleaning liquid or by shifting a cleaning liquid pouring position to which the cleaning liquid is poured from the central part while the substrate holding device is rotating; expanding the dry area outward from the central part of the substrate by with rotating the substrate holding device at a rotating speed not lower than 1500 rpm without pouring the cleaning liquid onto the dry area; and pouring the cleaning liquid onto an outer area contiguously surrounding the dry area on the surface of the substrate.

The upper limit of the rotating speed of the substrate is determined such that a marginal part of the cleaning liquid contiguous with the margin of the circular dry area is able to wash out particles remaining on the surface of the substrate as the circular dray area expands radially. Preferably, the rotating speed of the substrate is between 1500 and 2500 rpm. A desirable rotating speed of the substrate is about 2000 rpm to avoid producing a mist of the cleaning liquid.

The cleaning method according to the present invention may further include the step of stopping pouring the cleaning liquid at a position inside the peripheral edge of the substrate and at a predetermined distance from the center of the substrate succeeding the step of pouring the cleaning liquid onto an area outside the dry area.

Preferably, the predetermined distance from the center of the substrate is 50 mm or above if the substrate is a semiconductor wafer of a diameter not smaller than 8 in. Preferably, the predetermined distance is in the range of 50 mm from the center of the substrate to a distance from the center of the substrate to a position at a distance of 5 mm or above toward the center from the peripheral edge of the substrate. More specifically, the predetermined distance from the center of the substrate is in the range of 50 to 95 mm, i.e., a distance in the range of 50 mm from the center of the substrate to a distance from the center of the substrate to a position at 5 mm or above from the peripheral edge toward the center of the substrate, if the substrate is an 8 in. diameter semiconductor wafer. Normally, the predetermined distance is 80 mm for an 8 in. diameter semiconductor wafer. The predetermined distance is 50 mm or above from the center of the substrate and 145 mm or below from the center of the substrate, i.e., a distance in the range of 50 mm from the center of the substrate to a distance from the center of the substrate to a position at 5 mm or above from the peripheral edge toward the center of the substrate, if the substrate is an 12 in. diameter semiconductor wafer. Normally, the predetermined distance is 80 mm for a 12 in. diameter semiconductor wafer.

The step of pouring the cleaning liquid onto the outer area contiguously surrounding the dry area on the surface of the substrate may pour the cleaning liquid through a cleaning liquid pouring nozzle for pouring the cleaning liquid onto the central part of the substrate or through another nozzle.

Preferably, the step of pouring the cleaning liquid onto the outer area contiguously surrounding the dry area on the surface of the substrate is performed with reference to data on the expanse of the dry area provided by an image sensor.

Preferably, the step of creating a dry area in a central part of a substrate includes, in addition to stopping pouring the cleaning liquid or shifting a position onto which the cleaning liquid is poured radially outward from the center of the substrate, blowing a gas onto a central part of the substrate for a moment and instantly stopping blowing the gas.

A developing apparatus for developing an exposed film formed on a substrate by pouring a developer through a developer pouring nozzle onto the exposed film and subsequently cleaning the surface of the substrate in a second aspect of the present invention includes: a substrate holding device for holding a substrate in a horizontal position; a rotating mechanism for rotating the substrate holding device about a vertical axis; a cleaning liquid pouring nozzle for pouring a cleaning liquid onto the substrate held by the substrate holding device; a nozzle driving mechanism for shifting the cleaning liquid pouring nozzle; and a program specifying an operation including the steps of: rotating the substrate holding device and pouring the cleaning liquid through the cleaning liquid pouring nozzle onto a central part of the substrate; creating a dry area not wetted with the cleaning liquid in a central part of the substrate by shifting the cleaning liquid pouring nozzle radially outward from the central part of the substrate; expanding the dry area radially outward from the central part of the substrate by rotating the substrate holding device at a rotating speed not lower than 1500 rpm and moving the cleaning liquid pouring nozzle radially outward at a nozzle moving speed high enough to keep the cleaning liquid pouring position ahead of the margin of the dry area.

The program may be designed to execute a step of stopping pouring the cleaning liquid at a position on the substrate at a distance from the peripheral edge toward the center of the substrate and at a predetermined distance from the center toward the peripheral edge of the substrate in addition to the step of moving the cleaning liquid pouring position radially outward at a speed high enough to keep the cleaning liquid pouring position ahead of the margin of the dry area. The nozzle moving speed high enough to keep the cleaning liquid pouring position ahead of the margin of the dry area may be in the range of 10 to 30 mm/s. Preferably, a normal nozzle moving speed is about 10 mm/s. The developing apparatus may further include a gas blowing nozzle for blowing a gas onto the substrate. When the developing apparatus includes the gas blowing nozzle, the step of creating a dry area in a central part of the substrate may include blowing a gas onto a central part of the substrate for a moment immediately after shifting the cleaning liquid pouring position from the center of the substrate radially outward and instantly stopping blowing the gas.

The developing apparatus may further include an image sensor capable of providing data on the expanse of the dry area, and the program may be so designed as to execute the step of moving the cleaning liquid pouring nozzle radially outward at a nozzle moving speed high enough to keep the cleaning liquid pouring position ahead of the margin of the dry area with reference to the data on the expanse of the dry area provided by the image sensor.

A developing apparatus for developing an exposed film formed on a substrate by pouring a developer through a developer pouring nozzle onto the exposed film and subsequently cleaning the surface of the substrate in a third aspect of the present invention includes: a substrate holding device for holding a substrate in a horizontal position; a rotating mechanism for rotating the substrate holding device about a vertical axis; first and second cleaning liquid pouring nozzles for pouring a cleaning liquid onto the substrate held by the substrate holding device; and a program specifying an operation including the steps of rotating the substrate holding device, pouring the cleaning liquid through the first cleaning liquid pouring nozzle onto a central part of the substrate, and pouring the cleaning liquid through the second cleaning liquid pouring nozzle onto a position at a position at a predetermined distance from the center of the substrate; creating a dry area not wetted with the cleaning liquid in a central part of the substrate by stopping pouring the cleaning liquid through the first cleaning liquid pouring nozzle; expanding the dry area radially outward from the central part of the substrate by rotating the substrate holding device at a rotating speed not lower than 1500 rpm, and stopping pouring the cleaning liquid through the second cleaning liquid pouring nozzle before the dry area expands to a position onto which the second cleaning liquid pouring nozzle pours the cleaning liquid or moving the second cleaning liquid pouring nozzle radially outward at a nozzle moving speed high enough to keep the cleaning liquid pouring position ahead of the margin of the dry area.

The developing apparatus of the present invention may further include a gas blowing nozzle for blowing a gas onto the substrate, wherein the step of creating a dry area not wetted with the cleaning liquid in a central part of the substrate may include blowing the gas through the gas blowing nozzle onto the central part of the substrate immediately after stopping pouring the cleaning liquid through the first cleaning liquid pouring nozzle and instantly stopping blowing the gas.

The developing apparatus may further include an image sensor capable of providing data on the expanse of the dry area, wherein the step of stopping pouring the cleaning liquid through the second cleaning liquid pouring nozzle before the dry area expands to a position onto which the second cleaning liquid pouring nozzle pours the cleaning liquid or moving the second cleaning liquid pouring nozzle radially outward at a nozzle moving speed high enough to keep the cleaning liquid pouring position ahead of the margin of the dry area is executed with reference to the data on the expanse of the dry area provided by the image sensor.

The present invention pours the cleaning liquid onto a central part of the rotating substrate processed by the developing process to form a film of the cleaning liquid over the surface of the substrate, creates the dry area in the central part of the substrate, and rotates the substrate at a rotating speed not lower than 1500 rpm to expand the dry area radially by centrifugal force. Thus the dissolved product produced by the developing process can be very effectively removed, the amount of foreign matters remaining on the surface of the substrate can be reduced, and defects produced by the developing process and remaining on the substrate can be reduced. It is inferred that such an effect of reducing defects produced by the developing process and remaining on the substrate owes to the rapid, forcible radially outward run of a marginal part of the cleaning liquid film contiguous with the margin of the dry area, and the high capability of the marginal part of the cleaning liquid film for carrying the dissolution product away together with the cleaning liquid.

The dry area can be created in the central area more surely when the gas is blown onto the central part of the substrate after radially spreading the cleaning liquid poured onto the central part of the substrate in a cleaning liquid film and blowing the gas is stopped instantly than when any gas is not blown onto the central part of the substrate. Consequently, the effect of cleaning an area near the central area can be enhanced.

When pouring the cleaning liquid is stopped at a position at a position inside the peripheral edge of the substrate and at a predetermined distance from the center of the substrate, the disturbance of the cleaning liquid poured onto the substrate by high centrifugal force that acts on the cleaning liquid on the substrate rotating at a high rotating speed not lower than 1500 rpm and hence cleaning effect of the cleaning liquid can be enhanced.

DESCRIPTION OF THE PREFERRED EMBODIMENTS

First Embodiment

Figure 1:
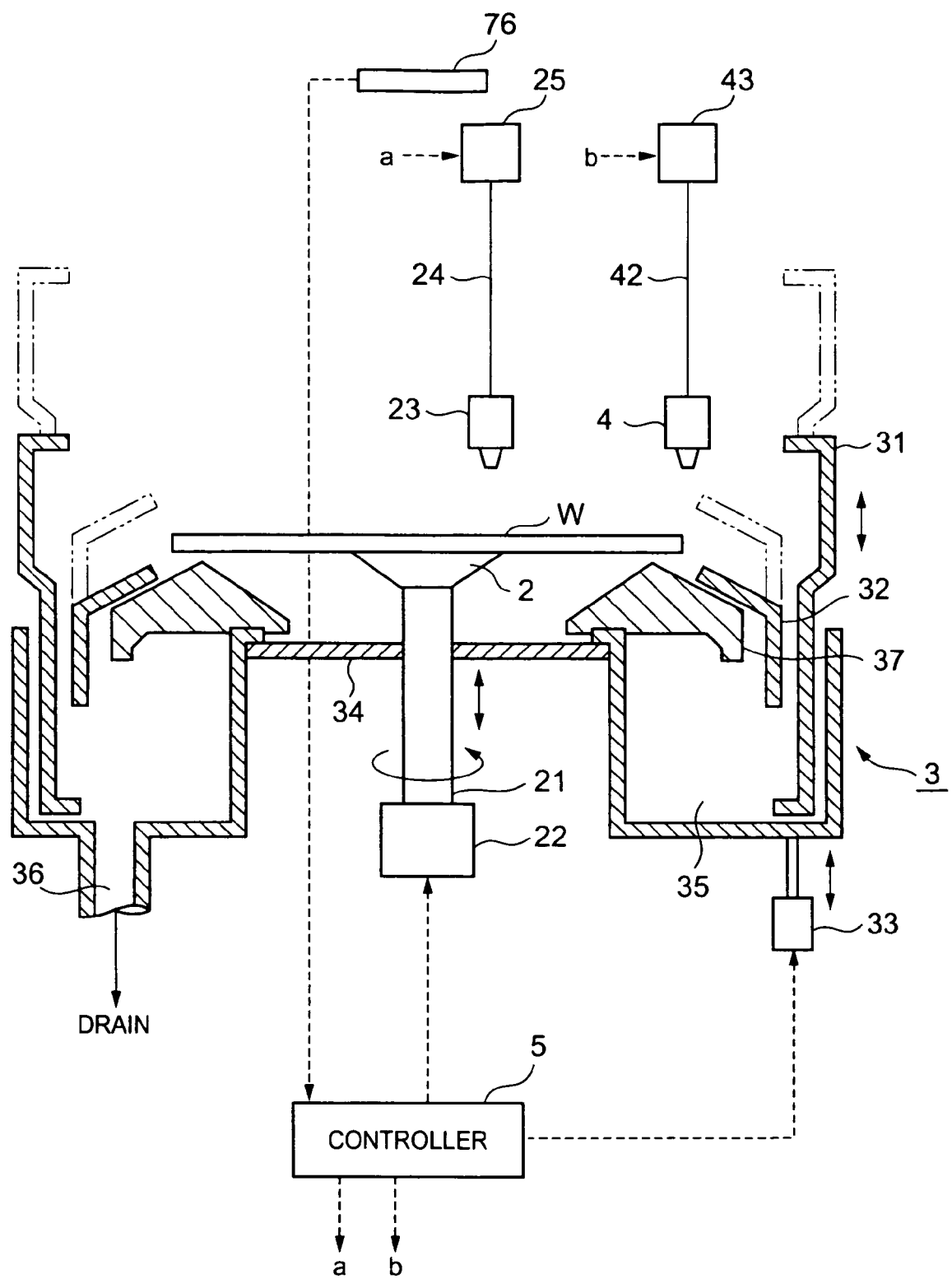
FIG. 1 is a schematic longitudinal sectional view of a developing apparatus in a first embodiment according to the present invention.
Figure 2:
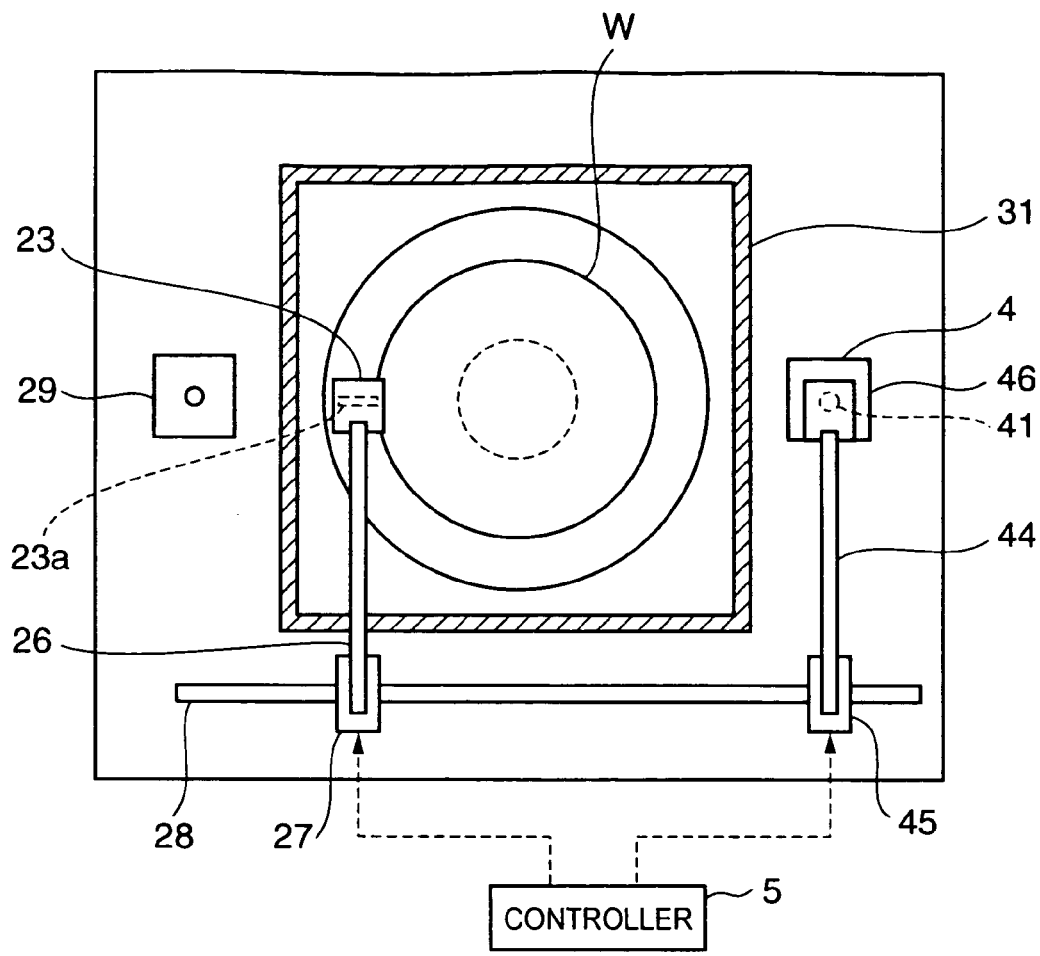
FIG. 2 is a schematic plan view of the developing apparatus in the first embodiment.

A developing apparatus in a first embodiment according to the present invention will be described with reference to FIGS. 1 and 2. Indicated at 2 in FIGS. 1 and 2 is a spin chuck, namely, a substrate holding device, for holding, for example, a wafer W, namely, a substrate, by suction in a horizontal position. The spin chuck 2 has a shaft 21 interlocked with a driving mechanism 22 including a rotative mechanism. The spin chuck 2 holding the wafer W is able to rotate and to move vertically. The wafer W is held by the spin chuck 2 coaxially with the shaft 21 of the spin chuck 2.

A cup device 3 opening upward surrounds the wafer W held on the spin chuck 2. The cup device 3 has an outer cup 31 having a rectangular upper part and a cylindrical lower part, and an inner cup 32 having a tapered upper part tapering upward. A lifting device 33 is connected to the lower end of the outer cup 31 to move the outer cup 31 vertically. A flange formed at the lower end of the outer cup 31 comes into contact with the inner cup 32 to raise the inner cup 32 as the outer cup 31 moves upward.

A disk 34 is disposed at a lower part of the spin chuck 2. An annular liquid sump 35 defining an annular space having a U-shaped cross section is attached to the circumference of the disk 34. A drain port 36 is formed in the bottom wall of the liquid sump 35. A developer and a cleaning liquid dripped from the wafer W or shook off the wafer W collect in the liquid sump 35 and are drained through the drain port 36. A ring 37 having a triangular cross section surrounds the disk 34. For example three vertically movable substrate support pins, not shown, extend vertically through the disk 34. The wafer W is placed on and is taken away from the spin chuck 2 by cooperative operations of a substrate carrying device, not shown, and the substrate support pins.

The developing apparatus is provided with a developer pouring nozzle 23 and a cleaning liquid pouring nozzle 4. As shown in FIG. 2, the developer pouring nozzle 23 has a nozzle exit 23a having the shape of, for example, a slit parallel to a diameter of the wafer W held on the spin chuck 2. The developer pouring nozzle 23 is connected to a developer supply system 25 by a developer supply line 24, such as a pipe. The developer supply system 25 includes a developer source and a supply controller.

A nozzle support arm 26 has one end supporting the developer pouring nozzle 23 thereon and the other end connected to a carrying device 27 provided with a lifting mechanism, not shown. The carrying device 27 including the lifting mechanism is moved laterally along a guide member 28 extended in an X direction, for example, on the bottom wall of a casing by a driving mechanism, not shown. The developer pouring nozzle 23 is held by a nozzle holding device 29 at its home position. The nozzle holding device 29 cleans the tip of the developer pouring nozzle 23.

As shown in FIG. 2, the cleaning liquid pouring nozzle 4 has a small nozzle exit 41 of, for example 4.3 mm in diameter (a ¼ tube having a wall thickness of 1.0 mm). A cleaning liquid supply line 42, such as a pipe, has one end connected to the cleaning liquid pouring nozzle 4 and the other end connected to a cleaning liquid supply system 43. The cleaning liquid supply system 43 includes a cleaning liquid source and a supply controller provided with a variable discharge pump and valves. An arm 44 has one end holding the cleaning liquid pouring nozzle 4 and the other end connected to a carrying device 45 provided with a lifting mechanism, not shown. The carrying device 45 is moved laterally together with the lifting mechanism along, for example, the guide member 28 by a driving mechanism, not shown so that the cleaning liquid pouring nozzle 4 may not collide with the developer pouring nozzle 23. The cleaning liquid pouring nozzle 4 is held at its home position by a nozzle holding device 46.

A controller 5 including a computer is provided with a program specifying a procedure including steps to be executed by the developing apparatus. The controller 5 provides control signals according to the program to control the developer supply system 25, the driving mechanism for moving the developer pouring nozzle 23, the cleaning liquid supply system 43, the driving mechanism for moving the cleaning liquid pouring nozzle 4, the driving mechanism 22 for driving the spin chuck 2, and the lifting device 33 for vertically moving the cup device 3.

A description will be made of a series of steps of a developing and cleaning procedure for developing an exposed resist film formed on the wafer W, namely, the substrate, and cleaning the wafer W after development. The outer cup 31 and the inner cup 32 are at their lower positions, and the developer pouring nozzle 23 and the cleaning liquid nozzle 4 are held by the nozzle holding devices 29 and 46, respectively. The wafer W on which the exposed resist film is formed is carried by the substrate carrying device, not shown, to the developing apparatus. Then, the wafer W is placed on the spin chuck 2 by the cooperative operations of the substrate carrying device and the substrate support pins.

Subsequently, the outer cup 31 and the inner cup 32 are placed at their upper positions, respectively. The developer pouring nozzle 23 is disposed at a position slightly outside the left end, as viewed in FIG. 2, of the peripheral edge of the wafer and at a low height from a plane containing the upper surface of the wafer W, and the cleaning liquid pouring nozzle 4 is disposed such that the nozzle exit 41 thereof is, for example, at a position slightly outside the right end, as viewed in FIG. 2, of the peripheral edge of the wafer W and at a low height from the plane containing the upper surface of the wafer W. The nozzle exit 23a of the developer pouring nozzle 23 is at a height, for example, in the range of 1 to 20 mm from the plane containing the surface of the wafer W.

Figure 3:
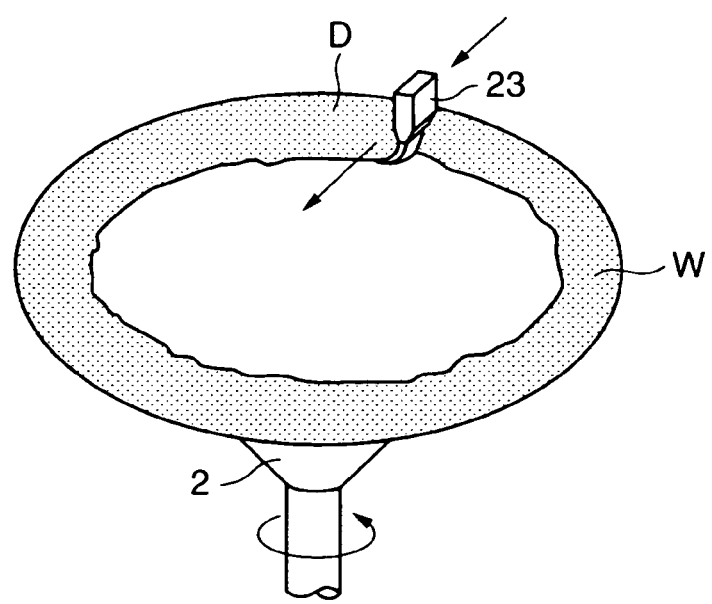
FIG. 3 is schematic perspective view of assistance in explaining pouring a cleaning liquid onto the surface of a wafer.

Then, the wafer W is rotated, for example, at a rotating speed of 500 rpm or above about a vertical axis and the developer pouring nozzle 23 is moved radially inward, i.e., toward the center of the wafer W, while a developer D is poured out in a band through the nozzle exit 23a having the shape of a slit. In this embodiment, the rotating speed of the wafer w is, for example, in the range of 1000 to 1200 rpm. Thus the developer D is poured through the nozzle exit 23a in a substantially spiral band on the surface of the wafer W as shown in FIG. 3. Since the wafer W is rotating, the developer D poured onto the surface of the wafer W is forced to move radially outward along the surface of the wafer W by centrifugal force and, consequently, a thin film of the developer D is formed over the surface of the wafer W. Parts, dissolvable in the developer D, of the exposed resist film dissolves in the developer D and parts, undissolvable in the developer D, of the resist film forms a resist pattern.

Advantages of this developing method will be mentioned. When the developer D is poured in a band having a width extending in a direction parallel to the radius of the wafer W onto the wafer W rotating about a vertical axis, a substantially spiral band of the developer D is formed on the surface of the wafer W. Therefore, the developer pouring nozzle 23 can be moved at a high moving speed and hence the resist film can be developed in a short developing time. When the wafer W is kept rotating during development, a dissolution product produced by dissolving the dissolvable parts of the resist film in the developer can be removed and the dissolution product can be forced out of recesses in the resist pattern to remove the dissolution product from the wafer W.

Figure 4:
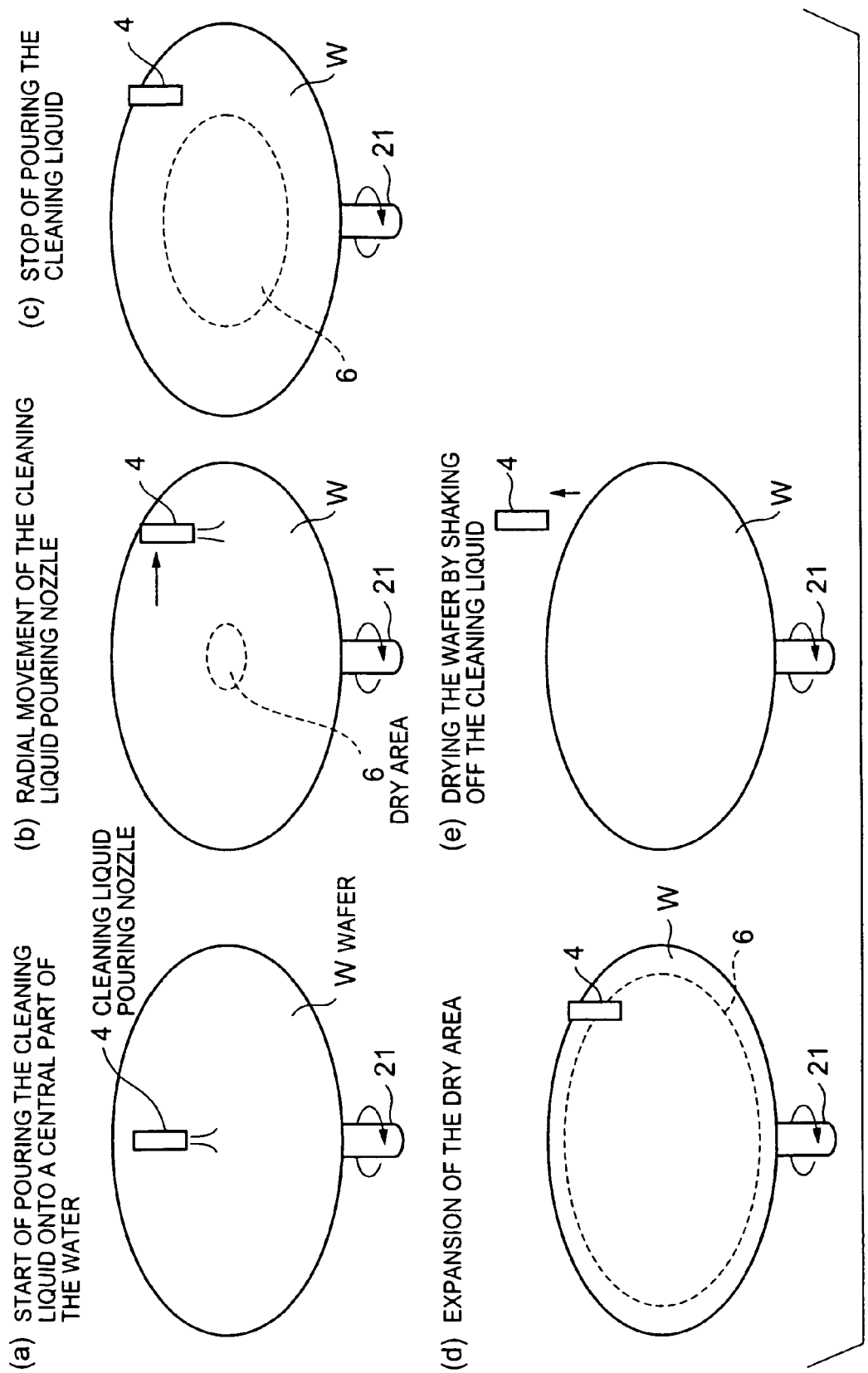
FIGS. 4(a) to 4(e) are schematic perspective views of assistance in explaining a method of cleaning a wafer by the developing apparatus in the first embodiment after a developing process.

Then, the developer pouring nozzle 23 is returned to its home position and the cleaning liquid pouring nozzle 4 is disposed above a central part of the wafer W. Immediately after the developer pouring nozzle 23 has stopped pouring the developer D. the cleaning liquid pouring nozzle 4 starts pouring a cleaning liquid R to clean the surface of the wafer W. A cleaning process for cleaning the surface of the wafer W will be described with reference to FIGS. 4 and 5. The cleaning process includes the following steps.

Step 1: Referring to FIG. 4(a), the cleaning liquid pouring nozzle 4 is disposed opposite to the center of the wafer W at a height in the range of 10 to 20 mm, for example at a height of 16 mm from the surface of the wafer W. The cleaning liquid is poured through the cleaning liquid pouring nozzle 4 onto a central part of the wafer W at a discharge rate in the range of 100 to 750 ml/min, preferably, in the range of 250 to 500 ml/min for 5 s. The cleaning liquid is, for example, pure water. The cleaning liquid poured onto the wafer W is forced to flow from the central part toward the peripheral edge of the wafer W by centrifugal force and forms a cleaning liquid film over the surface of the wafer W. The central part of the wafer W is an area at the center of the wafer W or an area in the vicinity of the center of the wafer W.

Step 2: Referring to FIG. 4(b), the cleaning liquid pouring nozzle 4 pouring out the cleaning liquid at a discharge rate of, for example, 250 ml/min is moved from a position corresponding to the central part of the wafer W toward a predetermined position at a moving speed in the range of 5 to 30 mm/s, normally, at 10 mm/s while the spin chuck 2 is rotating at a rotating speed in the range of 1500 to 200 rpm. When the position onto which the cleaning liquid is poured is thus moved radially outward from the central part of the wafer W, a dry area is created in the central part of the wafer W; that is, the cleaning liquid poured onto the central part of the wafer W flows radially away from the central part of the wafer W, the cleaning liquid film starts drying from its central part and a dry area 6, namely, a core, is formed in the central part of the wafer W. The dry area (core) 6 expands radially. It is important to move the cleaning liquid pouring nozzle 4 radially outward at a moving speed such that a position on the surface of the wafer W onto which the cleaning liquid is poured is always ahead of the margin of the dry area 6. Therefore, a preferable moving speed at which the cleaning liquid pouring nozzle 4 is dependent on the rotating speed of the wafer W and the discharge rate at which the cleaning liquid is poured out. The dry area 6 is an area of the surface of the wafer W exposed after the cleaning liquid wetting the area has evaporated. The dry area may be an area wetted with liquid drops of sizes on the order of micrometers.

Step 3: Referring to FIG. 4(c), pouring the cleaning liquid through the cleaning liquid pouring nozzle 4 is stopped immediately after the cleaning liquid pouring nozzle 4 has been stopped at a position inside the peripheral edge of the wafer W and at a predetermined distance from the center of the wafer W. Preferably, the predetermined distance is in the range of 50 mm or above from the center of the wafer W to a distance from the center of the wafer W to a position at a radial distance of 5 mm or above from the peripheral edge of the wafer W. More specifically, the predetermined distance is in the range of 50 to 95 mm from the center of the wafer W, i.e., in the range of 50 mm from the center of the wafer W to a distance from the center of the substrate to a position at 5 mm or above from the peripheral edge toward the center of the wafer W, if the wafer W is an 8 in. diameter wafer. Normally, the predetermined distance for an 8 in. diameter wafer is 80 mm. The predetermined distance is in the range of 50 to 145 mm from the center of the wafer W, i.e., a distance in the range of 50 mm from the center of the wafer W to a distance from the center of the wafer W to a position at 5 mm or above from the peripheral edge toward the center of the wafer W, if the substrate is an 12 in. diameter wafer. Normally, the predetermined distance is 80 mm for a 12 in. diameter wafer. If pouring the cleaning liquid is stopped at a position near the center of the wafer W, it is possible that the cleaning liquid wetting a peripheral part of the wafer W is caused to fly off the wafer W by centrifugal force and the peripheral part of the wafer W starts drying. Therefore, it is desirable to pour the largest possible quantity of the cleaning liquid onto an outer area, contiguously surrounding the dry area 6, on the surface of the wafer W after the dry area has been created. An operation for stopping pouring the cleaning liquid is timed such that pouring the cleaning liquid is stopped before the margin of the dry area 6 reaches a position onto which the cleaning liquid is poured. If the cleaning liquid pouring nozzle 4 is stopped at a position at a distance of 80 mm from the center of the wafer W, pouring the cleaning liquid is stopped, for example, within 1 s after the cleaning liquid pouring nozzle 4 has been stopped. In step 3, it is preferable to continue supplying the cleaning liquid to the cleaning liquid pouring nozzle 4 until the moment immediately before the arrival of the margin of the dry area 6 at a position onto which the cleaning liquid is poured. Only supply of the cleaning liquid to the cleaning liquid pouring nozzle 4 may be stopped without stopping moving the cleaning liquid pouring nozzle 4.

If the cleaning liquid pouring nozzle 4 is stopped at a position too far from the center of the wafer W, the centrifugal force acting on the cleaning liquid increases. Consequently, the cleaning liquid poured onto the surface of the wafer W splashes, the flow of the cleaning liquid on the wafer W is disturbed, foreign matters, such as the dissolution product or particles, adhered to the wafer W in the developing process is stirred up, the foreign matter removing function of the margin of the dry area 6 becomes ineffective and, consequently, there is a strong possibility that the foreign matters remain on the wafer W. If the cleaning liquid pouring nozzle 4 is stopped at a position near the center of the wafer W, the margin of the dry are 6 reaches a position onto which the cleaning liquid is poured in a very short time. Since pouring the cleaning liquid must be stopped before the margin of the dry are 6 reaches a position onto which the cleaning liquid is poured, a peripheral part of the wafer W cannot be wetted with a sufficient quantity of the cleaning liquid. In view of such problems, it is preferable to move the cleaning liquid pouring nozzle 4 pouring out the cleaning liquid to a position at a distance in the range of 50 mm from the center of the wafer W to a distance from the center of the wafer W to a position at 5 mm from the peripheral edge of the wafer W and to continue pouring out the cleaning liquid until the moment immediately before the margin of the dry area 6 reaches the position where the cleaning liquid pouring nozzle 4 is stopped. More specifically, it is preferable to continue pouring out the cleaning liquid until a moment immediately before the margin of the dry area 6 reaches a position at a predetermined position. The predetermined position is at a distance in the range of 50 to 95 mm from the center of the substrate, i.e., a position at a distance in the range of 50 mm from the center of the wafer W to a distance from the center of the wafer W to a position at 5 mm from the peripheral edge toward the center of the substrate, if the substrate is an 8 in. diameter semiconductor wafer or in the range of 50 to 145 mm from the center of the substrate, i.e., a distance in the range of 50 mm and a distance from the center of the wafer W to a position at 5 mm or above from the peripheral edge toward the center of the wafer W, if the wafer W is an 12 in. diameter semiconductor wafer. Normally, the predetermined distance is 80 mm for an 8 in. diameter semiconductor wafer and is 80 mm for a 12 in. diameter semiconductor wafer. According to the present invention the cleaning liquid pouring nozzle 4 pouring out the cleaning liquid may be moved to the peripheral edge of the wafer W with out stopping the cleaning liquid pouring nozzle 4. The cleaning effect of such a mode of pouring the cleaning liquid according to the present invention is higher that of the conventional spin cleaning mode.

Step 4: The wafer W is rotated continuously at that rotating speed (2000 rpm in this example) after stopping pouring the cleaning liquid through the cleaning liquid pouring nozzle 4 to expand the dry area 6 radially outward as shown in FIG. 4(d). As the dry area expands radially, the evaporated cleaning liquid R exerts pressure on a marginal part of a film of the cleaning liquid R contiguous with the margin of the dry area 6 and, consequently, the marginal part of the film of the cleaning liquid R rises in a bank as shown in FIGS. 5(a) and 5(b). The bank of the cleaning liquid R runs to the peripheral edge of the wafer W. When the cleaning liquid rises to form the bank, foreign matters lying between the surface of the wafer W and the film of the cleaning liquid are stirred up and are carried outside the wafer W by the cleaning liquid.

Step 5: After the dry area 6 has expanded to the peripheral edge of the wafer W, the cleaning liquid pouring nozzle 4 is moved away from the wafer W and the wafer W is kept rotating to dry the wafer W by shaking off liquid drops remaining on the wafer W by centrifugal force. The rotating speed of the wafer W to dry the wafer by shaking off liquid drops is 2000 rpm when the wafer W is a 12 in. diameter wafer or 4000 rpm when the wafer W is an 8 in. diameter wafer. Preferably, the rotating speed for drying the wafer by shaking off liquid drops is in the range of 2000 to 2500 rpm for 12 in. diameter wafers and in the range of 2000 to 2500 rpm for 8 in. diameter wafers.

The CPU reads the program from the storage device of the controller 5 and provides control signals for controlling the component mechanisms on the basis of instructions specified in the program to execute a series of steps 1 to 5. The step 1 for forming a film of the cleaning liquid over the surface of the wafer W needs to achieve only wetting the entire surface of the wafer W with the cleaning liquid and hence there are not any particular restrictions on the rotating speed of the wafer W and the cleaning liquid pouring rate. For example, the rotating speed and the cleaning liquid pouring rate for the step 1 may be the same as those for the step 2.

The developing apparatus in the first embodiment rotates the wafer W processed by the developing process to spread the cleaning liquid radially from the central part of the wafer W to form the film of the cleaning liquid, creates the dry area 6 in the central part of the wafer W, and then rotates the wafer W at 1500 rpm to expand the dry area 6 by centrifugal force. Therefore, foreign matters remaining on the surface of the wafer W can be highly effectively removed by the cleaning mechanism as estimated with reference to FIG. 5 and as will be well supported by the following description of other embodiments, foreign matters remaining on the surface of the wafer W can be reduced and the production of defects by the developing process can be suppressed. A cleaning time, i.e., a time between a moment pouring the cleaning liquid is started and a moment shaking off liquid drops and drying the wafer W can be started, is as short as 10 s or less and hence the throughput can be improved.

Second Embodiment

Figure 6:
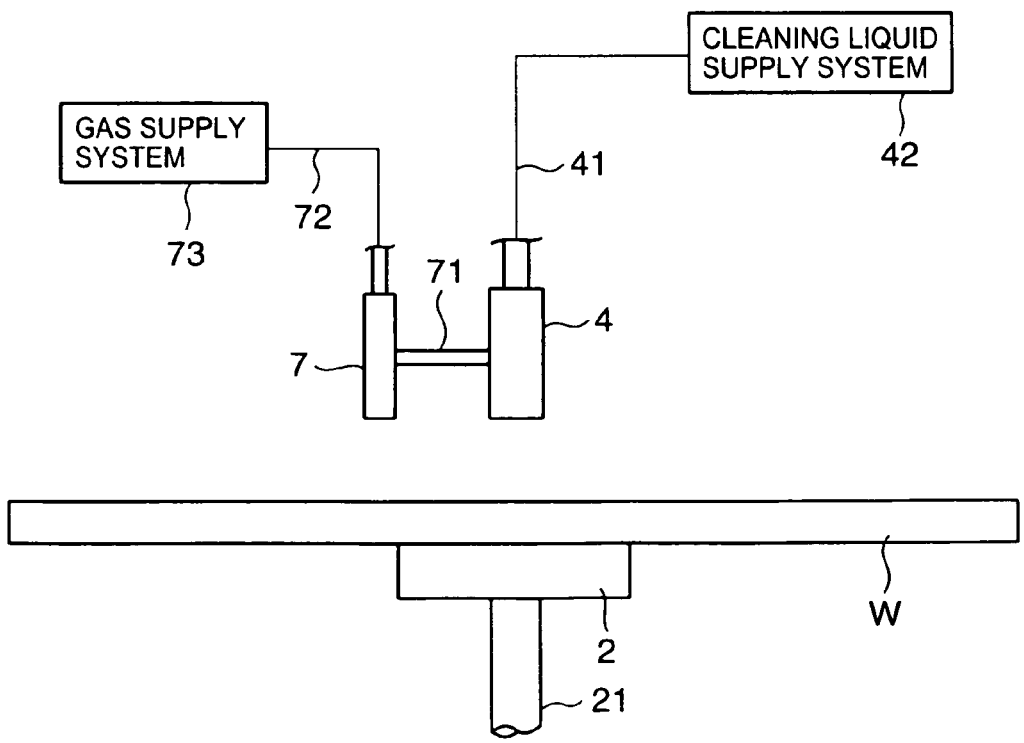
FIG. 6 is a schematic side elevation of an essential part of a developing apparatus in a second embodiment according to the present invention.

A developing apparatus in a second embodiment according to the present invention differs from the developing apparatus in the first embodiment in being provided with a gas blowing nozzle 7 in addition to components like those of the developing apparatus in the first embodiment. As shown in FIG. 6, the gas blowing nozzle 7 may be held together with a cleaning liquid pouring nozzle 4 on a common arm for movement together with the cleaning liquid pouring nozzle 4 or the cleaning liquid pouring nozzle 4 and the gas blowing nozzle 7 may be separately moved. In FIG. 6, the gas blowing nozzle 7 and the cleaning liquid pouring nozzle 4 are fixedly connected by a support member 71. The gas blowing nozzle 7 and the cleaning liquid pouring nozzle 4 are spaced about 30 mm apart. For example, a gas supply pipe connects the gas blowing nozzle 7 to a gas supply system 73. The gas supply system 73 includes a gas source, valves, flow regulators and such. The controller 5 controls the gas supply system 73 to control a gas supply operation.

Figure 7:
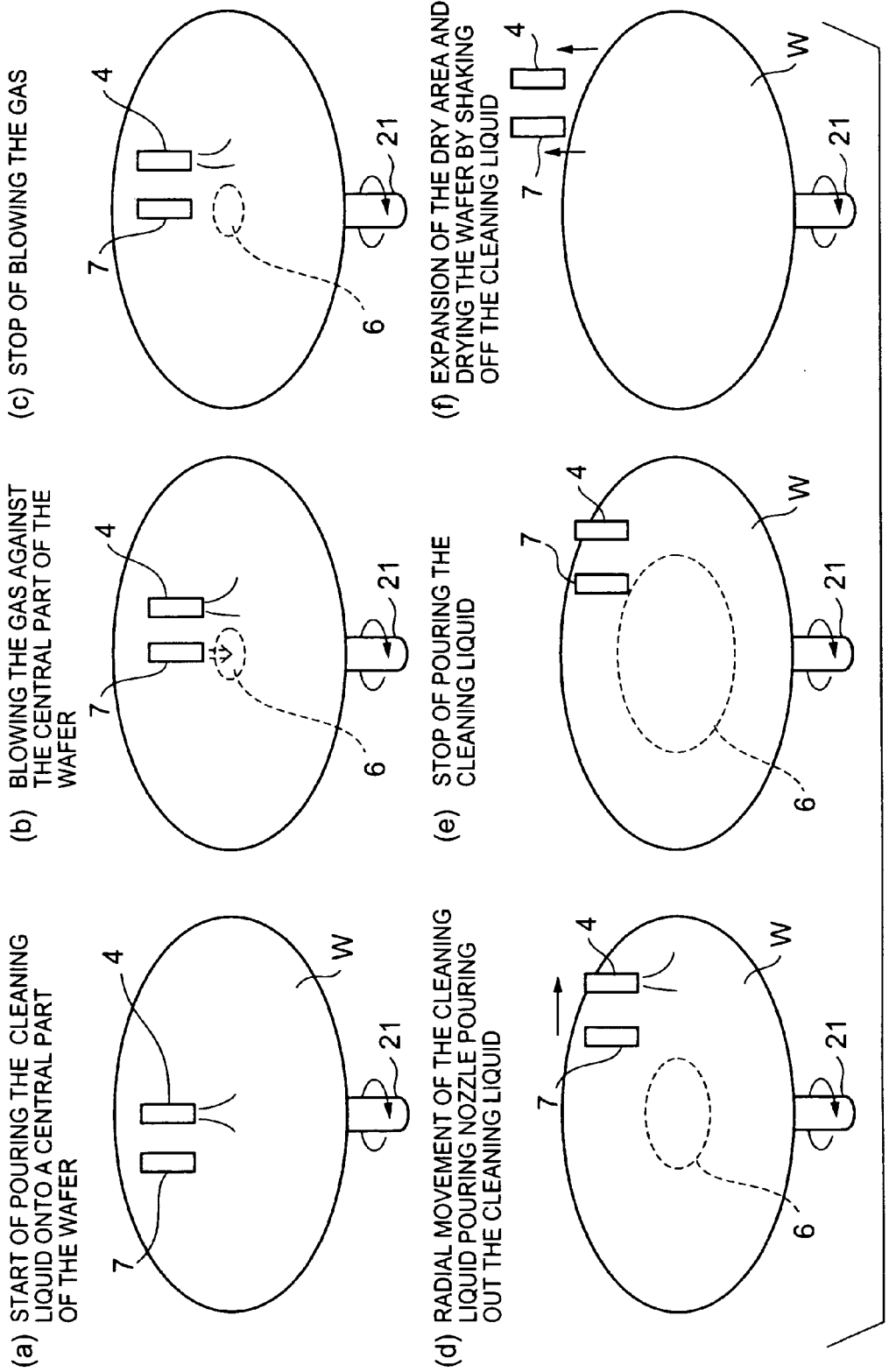
FIGS. 7(a) to 7(f) are schematic perspective views of assistance in explaining a method of cleaning a wafer by the developing apparatus in the second embodiment after a developing process.

A wafer W processed by a developing process is cleaned by a cleaning procedure illustrated in FIG. 7. The developing apparatus in the second embodiment differs from that in the first embodiment in blowing a gas against a central part of the wafer W after pouring a cleaning liquid onto the central part and instantly stopping blowing the gas, and is the same in other respects as the developing apparatus in the first embodiment. A gas blowing time for which the gas is blown against the central part is in the range of 0.5 to 2.0 s. A cleaning process will be described mainly in terms of operations different from those of the first embodiment.

Step 1: Referring to FIG. 7(*a*), a cleaning liquid, such as pure water, is poured through the cleaning liquid pouring nozzle 4 onto a central part of a wafer W.

Step 2: Referring to FIG. 7(*b*), the cleaning liquid pouring nozzle 4 pouring out the cleaning liquid at a predetermined pouring rate is moved for a distance corresponding to the distance between the cleaning liquid pouring nozzle 4 and the gas blowing nozzle 7 to a position at a distance from the center of the wafer W. Then, a gas is blown through the gas blowing nozzle 7 against the central part of the wafer W for 1 s, and then blowing the gas is stopped as shown in FIG. 7(*c*). A dry area 6, namely, a core, can be formed in the central part of the wafer W by shifting a pouring position at which the cleaning liquid is poured from the central part of the wafer W to a position outside the central part and blowing the gas against the central part of the wafer W.

Step 3: Referring to FIG. 7(*d*), the cleaning liquid pouring nozzle 4 pouring out the cleaning liquid is moved, in the manner as mentioned in connection with the description of the first embodiment, to a predetermined position at a distance in the range of 50 to 145 mm from the center of the wafer W, such as a position at 80 mm from the center of the wafer W, and the cleaning liquid pouring nozzle 4 is stopped and pouring the cleaning liquid is stopped as shown in FIG. 7(*e*). It is important to move the cleaning liquid pouring nozzle 4 radially outward at a moving speed such that a position on the surface of the wafer W onto which the cleaning liquid is poured is always ahead of the margin of the dry area 6.

Step 4: The rotation of the wafer W is continued after stopping pouring the cleaning liquid through the cleaning liquid pouring nozzle 4 to expand the dry area 6 radially outward. The rotating speed is 4000 rpm for an 8 in. diameter wafer and is 2000 rpm for a 12 in. diameter wafer. Subsequently, the cleaning liquid pouring nozzle 4 is moved away from the wafer W and the wafer W is kept rotating to dry the wafer W by shaking off liquid drops remaining on the wafer W as shown in FIG. 7(*f*).

A series of steps 1 to 4 are executed according to a program stored in a storage device included in a controller 5.

The second embodiment blows the gas against the central part of the wafer W after spreading a film of the cleaning liquid from the central part of the wafer W and stops blowing the gas instantly. Therefore, developing apparatus is able to form the dry area 6 more surely than the developing apparatus that does not blow a gas against the central part of the wafer and effect of cleaning an area near the center of the wafer can be enhanced.

Third Embodiment

A developing apparatus in a third embodiment according to the present invention differs from the developing apparatus in the first embodiment in being provided with two cleaning liquid pouring nozzles, namely, a first cleaning liquid pouring nozzle 4 and a second cleaning liquid pouring nozzle 8, pouring a cleaning liquid onto a central part of a wafer W through the first cleaning liquid pouring nozzle 4 and pouring the cleaning liquid onto a part at a predetermined distance from the center of the wafer W. A cleaning process will be described mainly in terms of operations different from those of the first embodiment.

Figure 8:
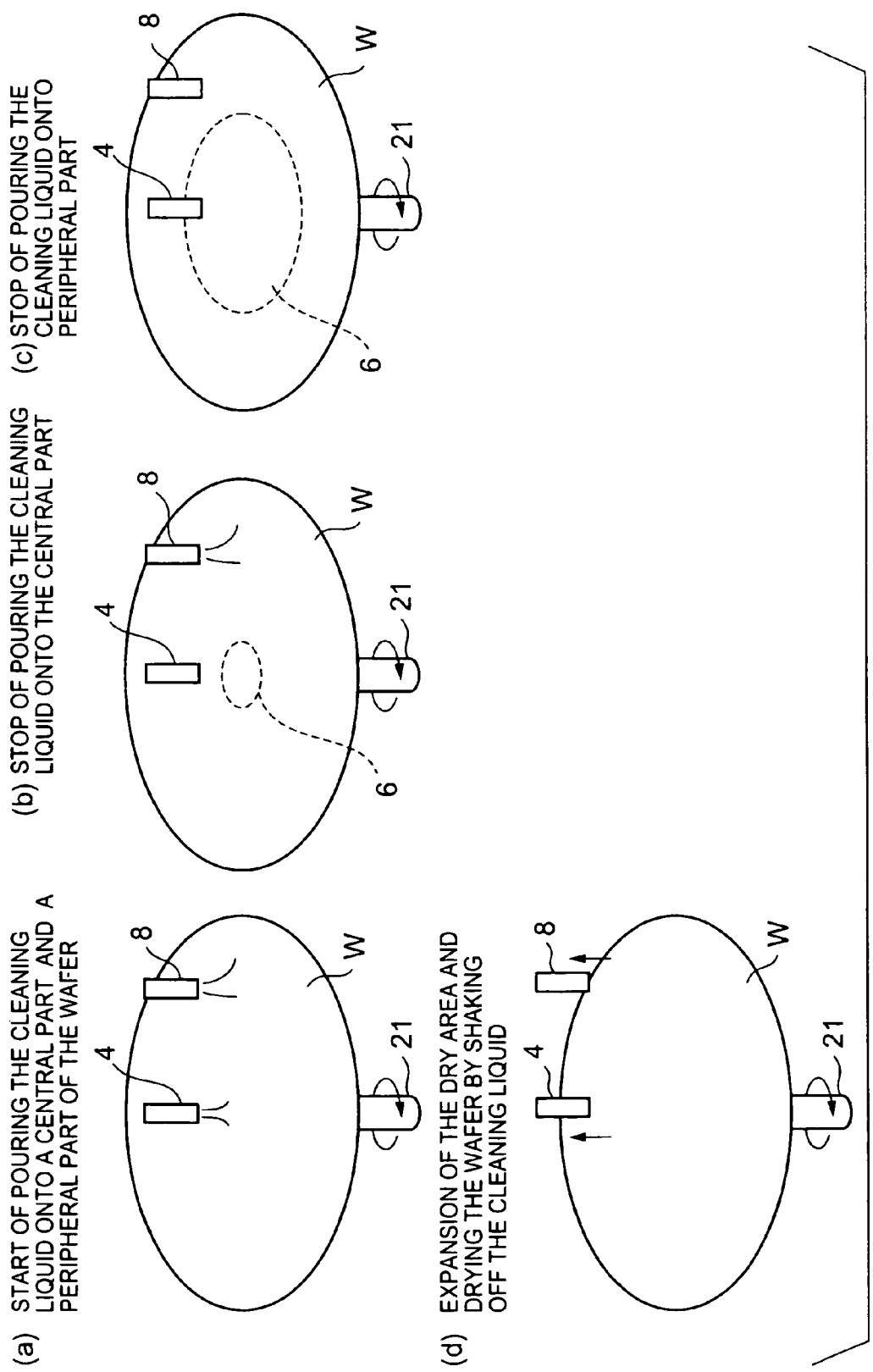
FIGS. 8(a) to 8(d) are schematic perspective views of assistance in explaining a method of cleaning a wafer by a developing apparatus in a third embodiment according to the present invention after a developing process.

Step 1: Referring to FIG. 8(*a*), the first cleaning liquid pouring nozzle 4 and the second cleaning liquid pouring nozzle 8 are disposed at a position corresponding to the center of the wafer W and at a position corresponding to a part of the wafer W, for example, at 80 mm from the center of the wafer W, respectively. Then, the first cleaning liquid pouring nozzle 4 and the second cleaning liquid pouring nozzle 8 pour out a cleaning liquid, such as pure water, simultaneously.

Step 2: Referring to FIG. 8(*b*), pouring out the cleaning liquid through the first cleaning liquid pouring nozzle 4 is stopped after pouring out the cleaning liquid, for example, for 5 s. Consequently, a dry area 6 is created in the central part of the wafer W.

Step 3: The dry area 6 expands radially outward over the surface of the wafer W. Pouring the cleaning liquid through the second cleaning liquid pouring nozzle 8 is stopped before the margin of the dry area 6 reaches a part of the wafer W onto which the cleaning liquid is poured by the second cleaning liquid pouring nozzle 8 as shown in FIG. 8(*c*).

Step 4: The rotation of the wafer W is continued after stopping pouring the cleaning liquid through the second cleaning liquid pouring nozzle 8 to expand the dry area 6 radially outward. Then, as shown in FIG. 8(*d*), the cleaning liquid pouring nozzles 4 and 8 are moved away from the wafer W, and liquid drops are shook off the wafer W to dry the wafer W in a manner similar to that mentioned in the description of the first embodiment.

A series of steps 1 to 4 are executed according to a program stores in a storage device included in a controller 5.

The third embodiment is the same in effect as the first embodiment. The cleaning liquid pouring nozzles 4 and 8 may be moved either individually by separate nozzle moving mechanisms or collectively by a single nozzle moving mechanism.

Fourth Embodiment

Figure 9:
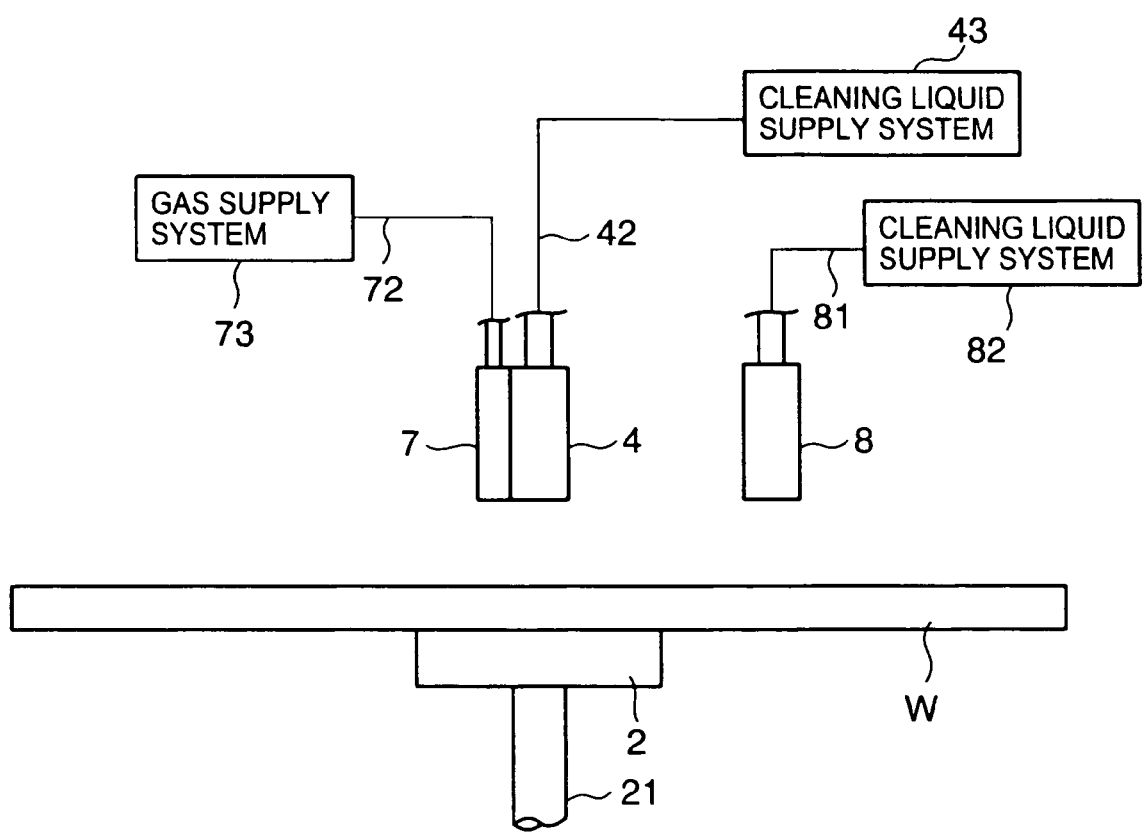
FIG. 9 is a schematic side elevation of an essential part of a developing apparatus in a fourth embodiment according to the present invention.

A fourth embodiment is a combination of the second and the third embodiment. FIG. 9 shows an essential part of a developing apparatus in the fourth embodiment. The developing apparatus in the fourth embodiment is provided with two cleaning liquid pouring nozzles, namely, a first cleaning liquid pouring nozzle 4 and a second cleaning liquid pouring nozzle 8, and a gas blowing nozzle 7. The first cleaning liquid pouring nozzle 4 does not need to be moved to a position corresponding to a part of a wafer outside a dry area 6 after pouring a cleaning liquid onto a central part of the wafer W. Therefore, the first cleaning liquid pouring nozzle 4 and the gas blowing nozzle 7 are combined close together and are moved by a single nozzle moving mechanism. A cleaning process to be performed by the developing apparatus in the fourth embodiment will be described.

Figure 10:
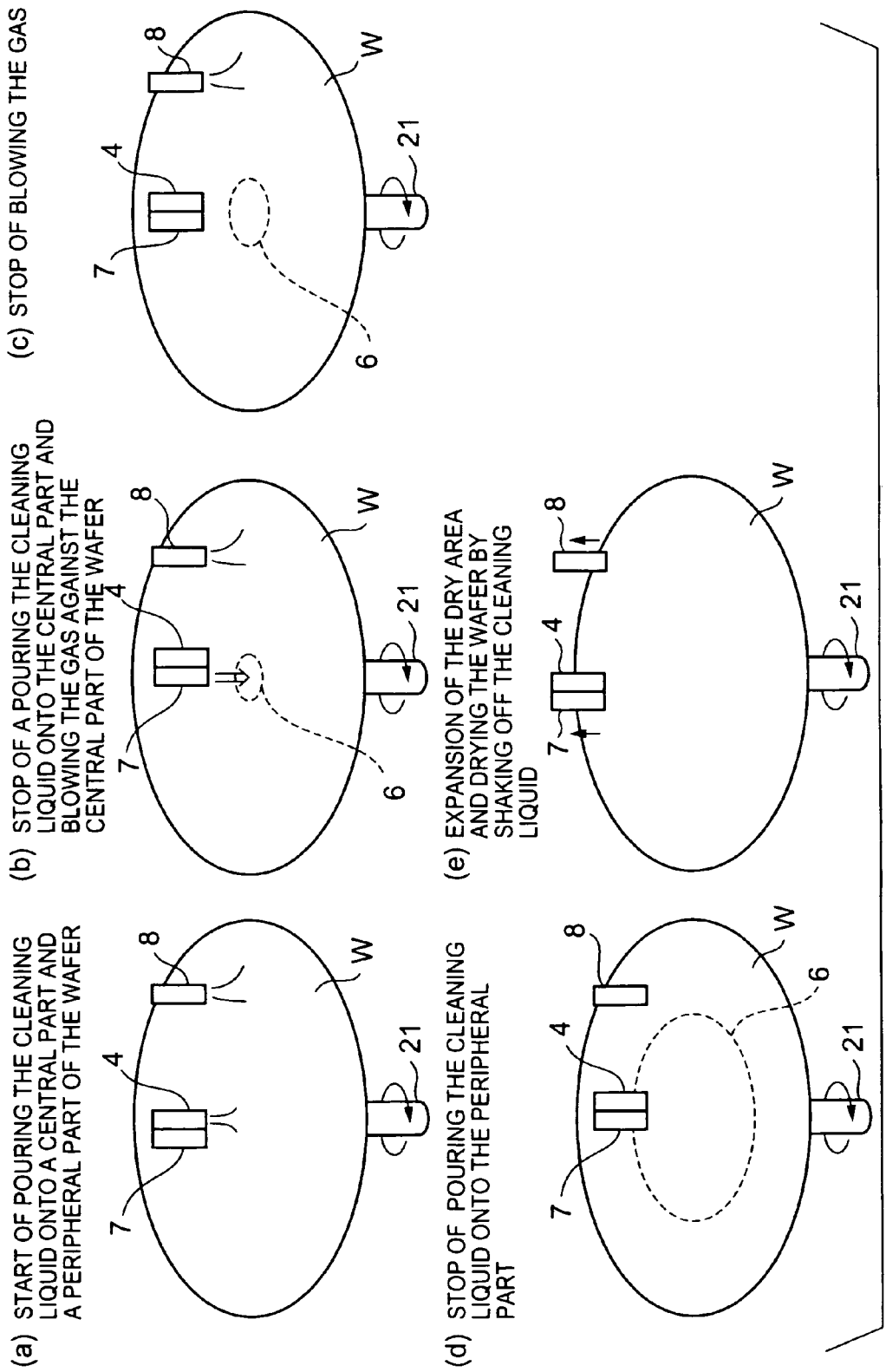
FIGS. 10(a) to 10(e) are schematic perspective views of assistance in explaining a method of cleaning a wafer by a developing apparatus in the third embodiment according to the present invention after a developing process.

Step 1: Referring to FIG. 10(*a*), the first cleaning liquid pouring nozzle 4 and the second cleaning liquid pouring nozzle 8 are disposed at a position corresponding to the center of the wafer W and at a position corresponding to a part of the wafer W, for example, at 80 mm from the center of the wafer W, respectively. Then, the first cleaning liquid pouring nozzle 4 and the second cleaning liquid pouring nozzle 8 pour out a cleaning liquid, such as pure water, simultaneously.

Step 2: Referring to FIG. 10(*b*), pouring the cleaning liquid through the first cleaning liquid pouring nozzle 4 is stopped after pouring the cleaning liquid, for example, for 5 s, and then a gas is blown through the gas blowing nozzle 7 against a central part of the wafer W, for example, for 1 s. Thus a dry area 6, namely, a core, can be surely created in the central part of the wafer W.

Step 3: Then, as shown in FIG. 10(*c*), blowing the gas through the gas blowing nozzle 7 is stopped and the wafer W is rotated continuously, for example, at 2000 rpm to expand the dry area 6, while the cleaning liquid is being poured out through the second cleaning liquid pouring nozzle 8.

Step 4: The dry area 76 expands radially over the surface of the wafer W. Pouring out the cleaning liquid through the second cleaning liquid pouring nozzle 8 is stopped before the margin of the dry area 6 reaches a part of the wafer W onto which the cleaning liquid is poured through the second cleaning liquid pouring nozzle 8 as shown in FIG. 10(*d*).

Step 5: The wafer W is rotated continuously at the same rotating speed after stopping pouring out the cleaning liquid through the second cleaning liquid pouring nozzle 8 to expand the dry area 6 radially outward. Then, as shown in FIG. 10(*e*), the cleaning liquid pouring nozzles 4 and 8 and the gas blowing nozzle 7 are moved away from the wafer W, and liquid drops are shook off the wafer W to dry the wafer W in a manner similar to that mentioned in the description of the first embodiment.

A series of steps 1 to 5 are executed according to a program stored in a storage device included in a controller 5.

The fourth embodiment is the same in effect as the second embodiment provided with the gas blowing nozzle 7. The fourth embodiment can be set for various conditions more easily than the second embodiment. The second embodiment needs to locate the gas blowing nozzle 7 at a position corresponding to the central part of the wafer W substantially simultaneously with shifting the first cleaning liquid pouring nozzle 4 away from the position corresponding to the central part of the wafer W and to move the first cleaning liquid pouring nozzle 4 such that a part of the wafer onto which the first cleaning liquid pouring nozzle 4 pours the cleaning liquid is always ahead of the margin of the expanding dry area 6. Since the fourth embodiment is provided with the two cleaning liquid pouring nozzles 4 and 8, the fourth embodiment does not need to perform such operations.

The cleaning liquid used by the present invention is not limited to pure water and may be, for example, a solution of a surface active agent. A solution of a surface active agent may be used for cleaning the wafer W, and then the wafer W may be cleaned with pure water. The wafer W may be processed by a precleaning process before cleaning the wafer W by the cleaning process mentioned above. In the precleaning process, a cleaning liquid may be poured, for example, continuously or intermittently onto a central part of a rotating wafer W.

Each of the first to the fourth embodiment estimates the expansion of the dry area 6 from the central part of the wafer W on the basis of empirical data. A developing apparatus provided with an image sensor 76 for measuring the expansion of the dry area 6 from the central part of the wafer W will be described.

The image sensor 76 may be, for example, a charge-coupled image sensor. The image sensor 76 is used in combination with an optical system including lenses and such and an illuminating light source. The image sensor 76 is disposed above the center of the wafer W so that the image sensor 76 may not obstruct the operations of the moving members including the cleaning liquid pouring nozzle 4. The image sensor 76 is controlled by a controller 5 and gives measured data to the controller 5. The controller 5 uses the measured data for controlling various operations.

Figure 5:
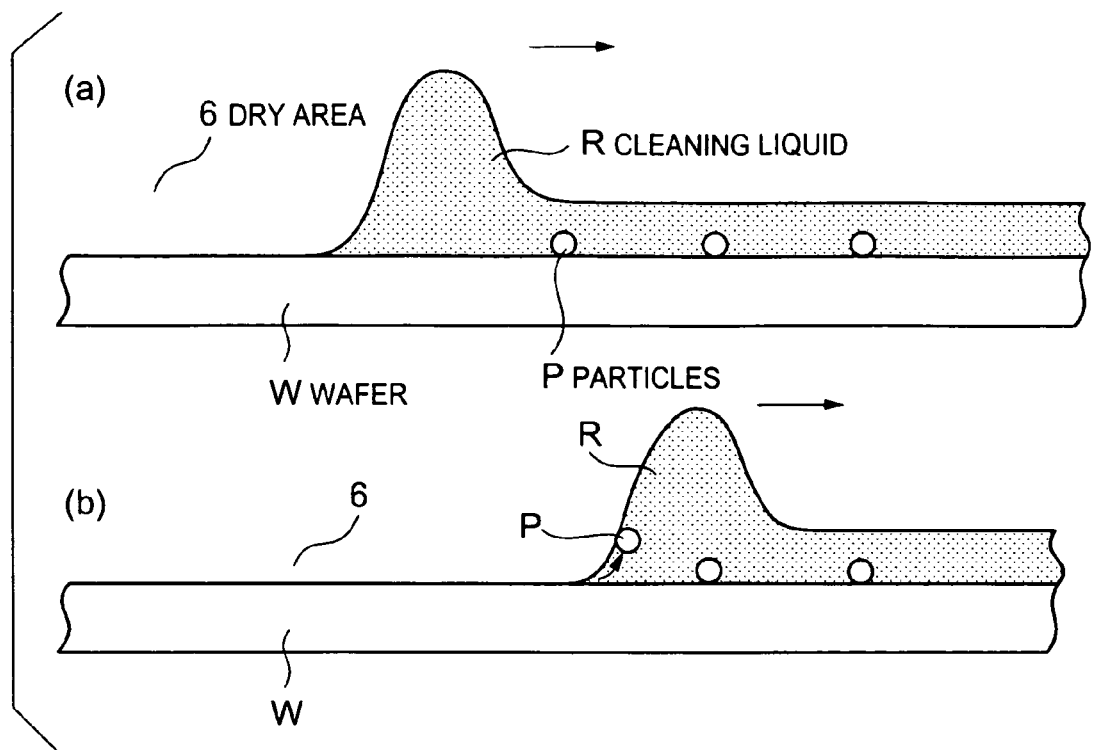
FIGS. 5(a) and 5(b) are typical views of assistance in explaining a process of cleaning the surface of a wafer.

The image sensor 76 senses the time-varying optical density of an image of the wafer W formed on its light-receiving surface by a lens and provides an output signal representing the time-varying condition of the dry area 6 varying with time. The optical density of an optical image of the surface of the wafer W changes at the boundary between the margin of the dry area and the outer area contiguously surrounding the dry area 6. Therefore the time-varying radius of the dry area 6 can be determined on the basis of the output signal provided by the image sensor 76. More specifically, the radius of the dry area 6 at every measuring time is determined by measuring the radial position of the inner margin of the film of the cleaning liquid R contiguous with the dry area 6 as shown in FIGS. 5(*a*) and 5(*b*) to determine the time-varying expanse of the dry area 6. If the dry area is not exactly circular, the shape of the dry area 6 is converted into an equivalent circle by software specified in a program, and the radius of the equivalent circle is determined. Although the distance between the center of the wafer W and the inner margin of the film of the cleaning liquid R corresponds to the radius of the dry area 6, the radius of the dry area 6 may be determined by subtracting a proper value from the radius determined in the foregoing manner. When the radius of the dry area 6 is thus determined, the cleaning liquid can be continuously poured through the moving cleaning liquid pouring nozzle 4 until a moment immediately before the margin of the dry area 6 reaches a part of the wafer W onto which the cleaning liquid is spouted.

The controller 5 is able control various controlled variables, such as the travel, position and moving speed of the cleaning liquid pouring nozzle 4, time for stopping the cleaning liquid pouring nozzle 4, the flow rate of the gas blown through the gas blowing nozzle 7 against the central part of the wafer W and time for blowing the gas on the basis of the information about the size of expanse of the dry area 6 provided by the image sensor 76. Since the expansion of the dry area 6 created in the central part of the wafer W can be measured by the image sensor 76, the respective positions of the cleaning liquid pouring nozzle 4 and the gas blowing nozzle 7, times for moving the cleaning liquid pouring nozzle 4 and the gas blowing nozzle 7 and the respective rates of supply of the cleaning liquid and the gas can be properly controlled.

EXAMPLES

Example 1

A 12 in. diameter wafer W processed by a resist film forming process, an exposure process and a developing process was cleaned by the developing apparatus in the second embodiment.

Comparative Example 1

A 12 in. diameter wafer W like that used in Example 1 was cleaned by the developing apparatus in the second embodiment. The gas was blown continuously after the gas nozzle 7 started blowing the gas against the central part of the wafer, the gas was blown through the gas blowing nozzle 7 against a part just on the inner side of a part onto which the cleaning liquid was poured through the cleaning liquid pouring nozzle 4, and the nozzles 4 and 7 were moved to the peripheral edge of the wafer W. The wafer W was rotated at the same rotating speed and the cleaning liquid was poured at the same pouring rate as those in Example 1.

Comparative Example 2

A wafer was cleaned by a conventional spin cleaning method that poured a cleaning liquid at a pouring rate of 1 l/min for 15 s.

The numbers of particles on the thus cleaned wafers were counted. The number of particles in Comparative example 1 was 28% and that in Example 1 was 8% when the number of particles in Comparative example was 100%. Results of the experimental cleaning operations proved that the cleaning effect of the cleaning method that blows the gas against the central part of the wafer and moves gas blowing position together with cleaning liquid pouring position to the peripheral edge of the wafer is higher than that of the cleaning method that only pours the cleaning liquid onto the central part of the wafer, and that the cleaning effect of the cleaning method of the present invention that blows the gas only against the central part of the wafer is far higher than those of the cleaning methods carried out in comparative examples.

Resist-Applying-and-Developing System

Figure 11:
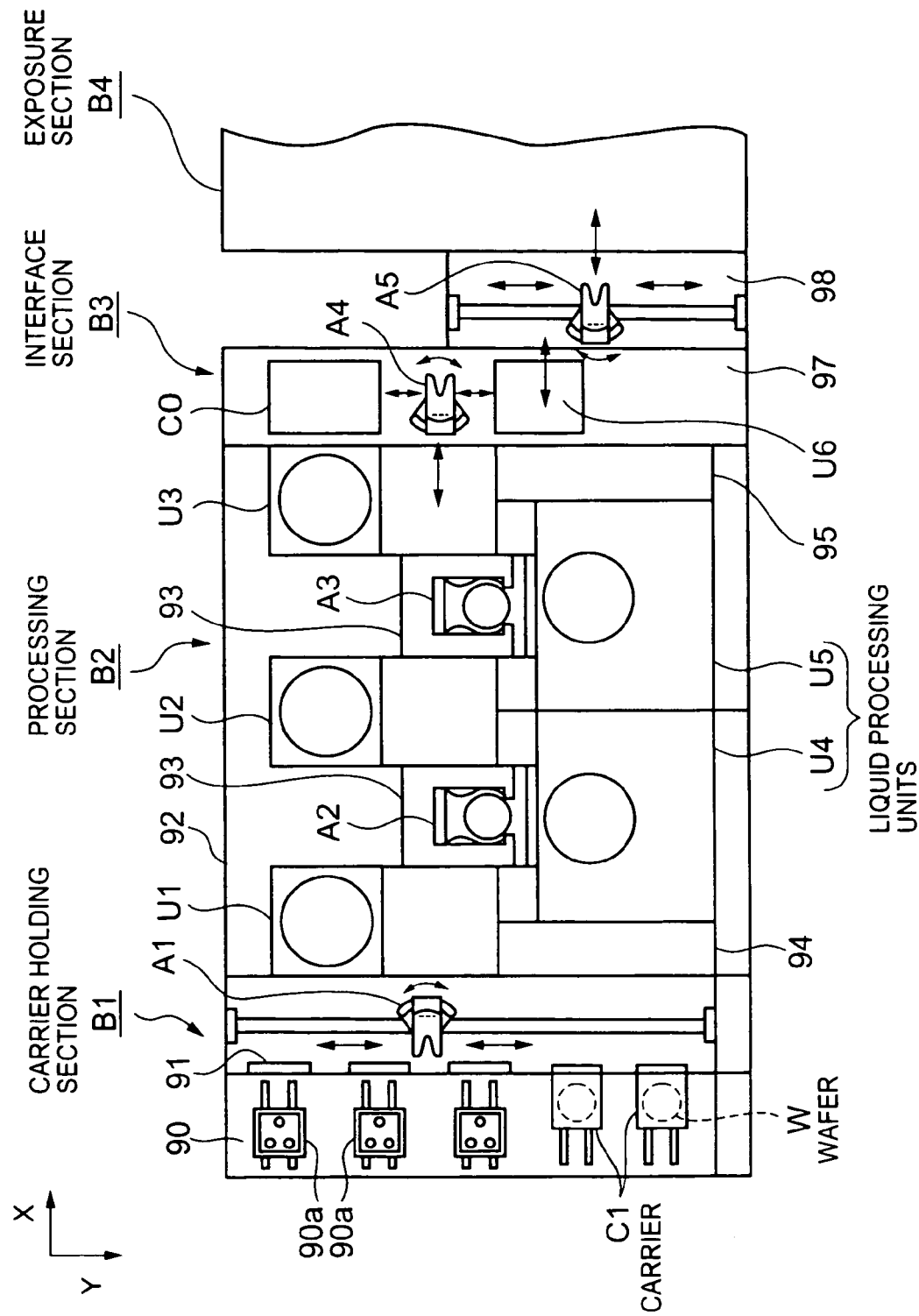
FIG. 11 is a schematic plan view of a resist pattern forming system including the foregoing developing apparatus.
Figure 12:
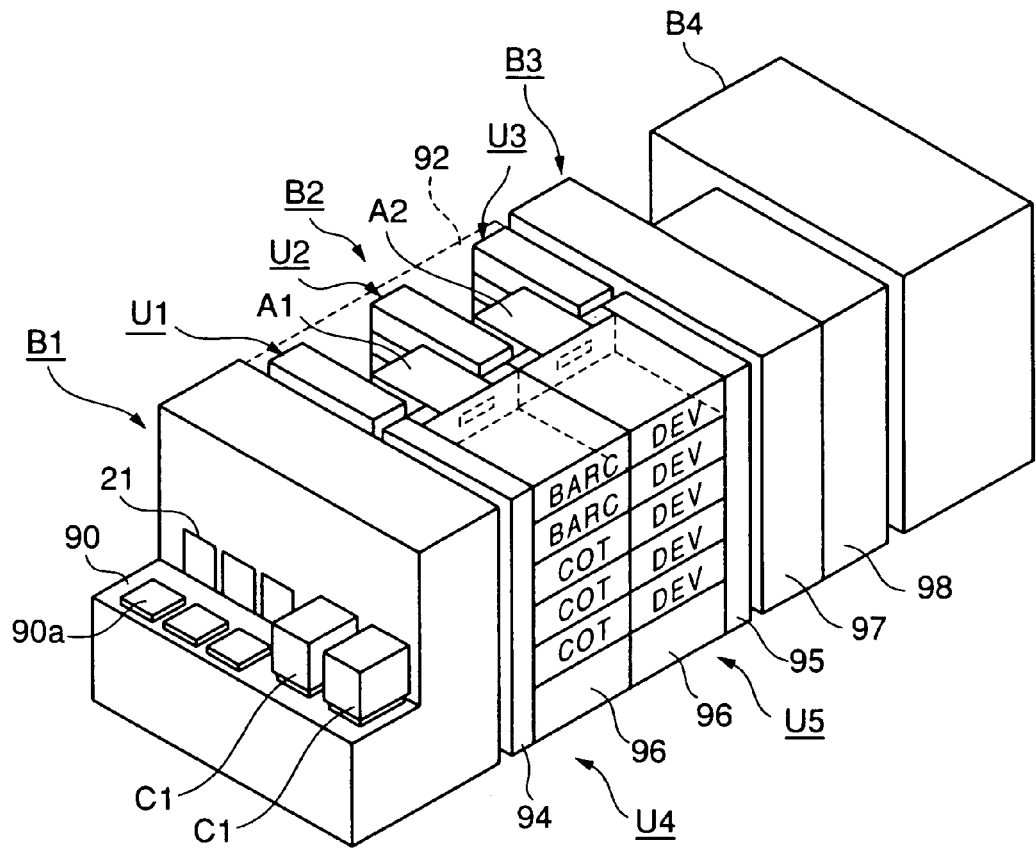
FIG. 12 is a perspective view of the resist pattern forming system including the foregoing developing system.
Figure 13:
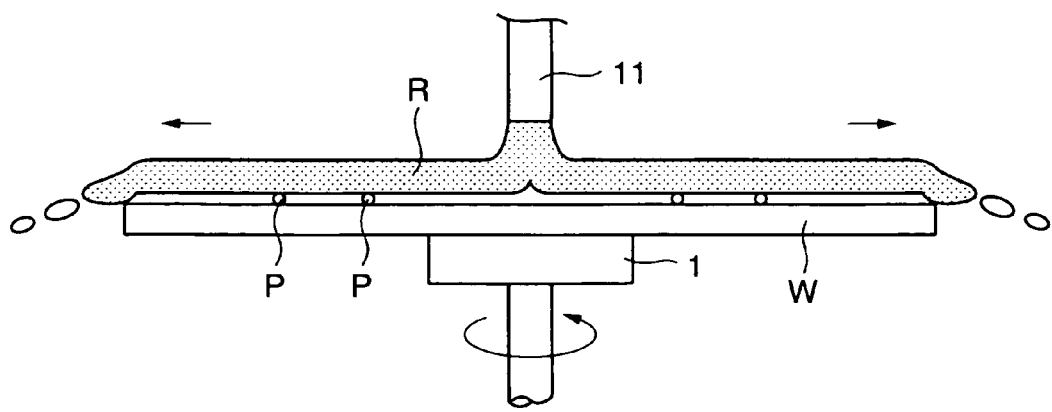
FIG. 13 is a typical view of assistance in explaining cleaning the surface of a wafer by a conventional cleaning method.

A resist-applying-and-developing system employing the developing apparatus of the present invention will be briefly described by way of example with reference to FIGS. 11 and 12. In FIGS. 11 and 12, indicated at B1 is a carrier holding section for holding carriers C1 each containing, for example, thirteen wafers W, namely, substrates, in an airtight fashion. The carrier holding section B1 has a carrier table 90 provided with a plurality of carrier holders 90a each for holding a carrier C1, gates 91 built in a wall on the front side of the carrier table 90, and a transfer device A1 for taking out the wafers W from the carrier C1 through the gate 91.

A processing section B2 contained in a housing 92 is connected to the front end of the carrier holding section B1. Included in the processing section B2 are shelved processing units U1, U2 and U3 formed by stacking heating/cooling devices, and main carrying devices A2 and A3 for carrying the wafers W between processing units including a resist pattern forming unit. The shelved processing units U1, U2 and U3 and the main carrying devices A2 and A3 are arranged alternately. The shelved processing units U1, U2 and U3 are arranged in a longitudinal row and the main carrying devices A2 and A3 are arranged in a longitudinal row. Joining parts joining adjacent ones of the shelved processing units U1, U2 and U3 and the main carrying devices A2 and A3 are provided with gates, respectively, to move the wafer W from the shelved processing unit U1 at one end of the processing section B2 through the processing section B2 to the shelved processing unit U3 at the other end of the processing section B2. The main carrying devices A2 and A3 are installed in spaces defined by side walls of the shelved processing units U1, U2 and U3, side walls of liquid processing units U4 and U5 on the right-hand side with respect to a longitudinal direction in which the shelved processing units U1, U2 and U3 are arranged, and partition walls 93. Indicated at 94 and 95 are temperature-and-humidity regulating units provided with temperature regulating devices for regulating the temperature of process liquids to be used by the processing units and air-conditioning ducts.

As shown in FIG. 16, the liquid processing unit U4 has coating devices COT and antireflection film forming devices BARC stacked in, for example, five layers on a storage unit 96, namely, chemical solution supply space, and the liquid processing unit U5 has developing devices DEV, namely, developing apparatuses according to the present invention, stacked in, for example, five layers on a storage unit 96. The shelved processing units U1, U2 and U3 have each various devices stacked in, for example, ten layers to process wafers before and after processes to be performed by the liquid processing units U4 and U5. The shelved processing units U1, U2 and U3 include heating devices to heat wafers W for baking and cooling devices to cool wafers W.

An interface section B3 is disposed behind the shelved processing unit U3 of the processing section B2 and an exposure section B4 is joined to the interface section B3. The interface section B3 has, for example, a first carrying chamber 97 and a second carrying chamber 98. The interface section has two transfer devices A4 and A5, a shelved processing unit U6 and a buffer carrier CO. The transfer devices A4 and A5 carry wafers W between the processing section B2 and the exposure section B4.

The flow of a wafer in this system will be described by way of example. A carrier C1 holding wafers W is delivered to the carrier table 90. Then, the gate 91 is opened and the lid of the carrier C1 is removed. The transfer device A1 takes out a wafer W from the carrier C1. The wafer W is transferred through a transfer unit, not shown, included in the shelved processing unit U1 to the main carrying device A2. The wafer W is subjected to pretreatment processes, such as antireflection film forming process and a cooling process, by the devices of the shelved processing units U1 to U3 before being subjected to a coating process. Subsequently, a liquid resist is applied to the wafer W by the coating device COT. Then, the wafer W is heated for baking by one of the heating devices of the shelved processing units U1 to U3, and the wafer W is cooled. Then, the cooled wafer W is transferred by the transfer device of the shelved processing unit U3 to the interface section B3. For example, the interface section B3 carries the wafer W to the shelved processing unit U6 by the transfer device A4, from the shelved processing unit U6 to the exposure section B4 by the transfer device A5. Then, the exposure section B4 processes the wafer W by an exposure process. After the completion of the exposure process, the wafer W is reversed to the main carrying device A2 and the resist film formed on the wafer W is developed by the developing device DEV to form a resist mask. Then, the wafer W is returned to the carrier C1 placed on the carrier table 90.

The invention claimed is:

1. A developing apparatus for developing an exposed film formed on a substrate by pouring a developer through a developer pouring nozzle onto the exposed film and subsequently cleaning the surface of the substrate, said developing apparatus comprising:
   a substrate holding device that holds a substrate in a horizontal position;
   a rotating mechanism that rotates the substrate holding device about a vertical axis;
   a cleaning liquid pouring nozzle that pours a cleaning liquid onto the substrate held by the substrate holding device;
   a nozzle driving mechanism that shifts the cleaning liquid pouring nozzle;
   at least one controller configured to control the rotating mechanism, the cleaning liquid pouring nozzle, and the nozzle driving mechanism by providing control signals to each of the rotating mechanism, the cleaning liquid pouring nozzle, and the nozzle driving mechanism such that the rotating mechanism rotates the substrate holding device at a rotating speed not lower than 1500 rpm and the cleaning liquid pouring nozzle pours the cleaning liquid onto the substrate while the nozzle driving mechanism shifts the cleaning liquid pouring nozzle radially outward relative to a center of the substrate at a nozzle moving speed high enough to keep the cleaning liquid pouring position ahead of a margin of a dry area not wetted with the cleaning liquid in a central part of the substrate that is created by the rotation of the substrate holding device; and
   a gas blowing nozzle that blows a gas onto the substrate, wherein the gas blowing nozzle is held together with the cleaning liquid pouring nozzle on a common arm so as to move together with the cleaning liquid pouring nozzle, wherein the at least one controller is configured to control the gas blowing nozzle by providing control signals to the gas blowing nozzle such that the gas blowing nozzle blows a gas onto the central part of the substrate for a predetermined time immediately after the nozzle driving mechanism shifts the cleaning liquid pouring nozzle from the center of the substrate, then the gas blowing nozzle instantly stops blowing the gas prior to the cleaning liquid pouring nozzle reaching the edge of the substrate as the nozzle driving mechanism shifts the cleaning liquid pouring nozzle radially outward relative to the center of the substrate.

2. The developing apparatus according to claim 1, wherein the at least one controller is configured to send control signals to each of the cleaning liquid pouring nozzle and the nozzle driving mechanism such that the cleaning liquid pouring nozzle stops pouring the cleaning liquid at a position on the substrate at a position that is spaced from a peripheral edge of the substrate in a direction that is towards the center of the substrate and at a predetermined distance from the center of the substrate in a direction that is towards the peripheral edge of the substrate after the nozzle driving mechanism shifts the cleaning liquid pouring nozzle radially outward relative to the center of the substrate at the nozzle moving speed high enough to keep the cleaning liquid pouring position ahead of the margin of the dry area not wetted with the cleaning liquid in the central part of the substrate.

3. The developing apparatus according to claim 2, wherein the substrate is a semiconductor wafer of a diameter not smaller than 8 in and the predetermined distance from the center of the substrate is 50 mm or above.

4. The developing apparatus according to claim 3, wherein the predetermined distance is a distance from the center of the substrate to a position at a distance of 5 mm or above toward the center from the peripheral edge of the substrate.

5. The developing apparatus according to claim 1, further comprising an image sensor that provides data on an expanse of the dry area, wherein the at least one controller is configured to control the nozzle driving mechanism based on the data on the expanse of the dry area provided by the image sensor such that the nozzle driving mechanism shifts the cleaning liquid pouring nozzle radially outward relative to the center of the substrate at the nozzle moving speed high enough to keep the cleaning liquid pouring position ahead of the margin of the dry area not wetted with the cleaning liquid in the central part of the substrate.

6. A developing apparatus for developing an exposed film formed on a substrate by pouring a developer through a developer pouring nozzle onto the exposed film and subsequently cleaning the surface of the substrate, said developing apparatus comprising:
   a substrate holding device that holds a substrate in a horizontal position;
   a rotating mechanism that rotates the substrate holding device about a vertical axis;
   first and second cleaning liquid pouring nozzles that pour a cleaning liquid onto the substrate held by the substrate holding device;
   at least one controller configured to control the rotating mechanism and the first and second cleaning liquid pouring nozzles by providing control signals to each of the rotating mechanism and the first and second cleaning liquid pouring nozzles such that the rotating mechanism rotates the substrate holding device, the first cleaning liquid pouring nozzle pours the cleaning liquid onto a central part of the substrate, and the second cleaning liquid pouring nozzle pours the cleaning liquid onto a position at a predetermined distance from the center of the substrate, such that the first cleaning liquid pouring nozzle stops pouring cleaning liquid and the rotating mechanism rotates the substrate holding device at a rotating speed not lower than 1500 rpm so as to create a dry area not wetted with the cleaning liquid in a central part of the substrate and such that the second cleaning liquid pouring nozzle stops pouring the cleaning liquid before the dry area expands to a position onto which the second cleaning liquid pouring nozzle pours the cleaning liquid or such that the second liquid cleaning nozzle is moved radially outward at a nozzle moving speed high enough to keep a cleaning liquid pouring position ahead of the margin of the dry area; and
   a gas blowing nozzle that blows a gas onto the substrate, wherein the gas blowing nozzle is held together with the first cleaning liquid pouring nozzle on a common arm so as to move together with the first cleaning liquid pouring nozzle, wherein the at least one controller is configured to control the gas blowing nozzle by providing control signals to the gas blowing nozzle such that the gas blowing nozzle blows a gas onto the central part of the substrate for a predetermined time immediately after a nozzle driving mechanism shifts the first cleaning liquid pouring nozzle from the center of the substrate, then the gas blowing nozzle instantly stops blowing the gas prior to the second liquid cleaning nozzle reaching the edge of the substrate when the second liquid cleaning nozzle is moved radially outward.

7. The developing apparatus according to claim 6, further comprising an image sensor that provides data on an expanse of the dry area,
wherein the at least one controller is configured to control the second cleaning liquid pouring nozzle based on the data on the expanse of the dry area provided by the image sensor such that the second liquid cleaning nozzle is moved radially outward at the nozzle moving speed high enough to keep the cleaning liquid pouring position ahead of the margin of the dry area.

8. A developing apparatus for developing an exposed film formed on a substrate by pouring a developer through a developer pouring nozzle onto the exposed film and subsequently cleaning the surface of the substrate, said developing apparatus comprising:
a substrate holding device that holds a substrate in a horizontal position;
a rotating mechanism that rotates the substrate holding device about a vertical axis;
a cleaning liquid pouring nozzle that pours a cleaning liquid onto the substrate held by the substrate holding device;
a nozzle driving mechanism that shifts the cleaning liquid pouring nozzle;
a gas blowing nozzle that blows a gas onto the substrate and that is held together with the cleaning liquid pouring nozzle on a common arm so as to move together with the cleaning liquid pouring nozzle; and
at least one controller programmed to control the rotating mechanism, the cleaning liquid pouring nozzle, and the nozzle driving mechanism,
wherein the developing apparatus includes a program controlling operation of the at least one controller such that the rotating mechanism rotates the substrate holding device at a rotating speed not lower than 1500 rpm and the cleaning liquid pouring nozzle pours the cleaning liquid onto the substrate while the nozzle driving mechanism shifts the cleaning liquid pouring nozzle radially outward at a nozzle moving speed high enough to keep the cleaning liquid pouring position ahead of a margin of a dry area not wetted with the cleaning liquid in a central part of the substrate that is created by the rotation of the substrate holding device, and
wherein the program controls operation of the at least one controller such that the gas blowing nozzle blows a gas onto the central part of the substrate for a predetermined time immediately after the nozzle driving mechanism shifts the cleaning liquid pouring nozzle from the center of the substrate, then the gas blowing nozzle instantly stops blowing the gas prior to the cleaning liquid pouring nozzle reaching the edge of the substrate as the nozzle driving mechanism shifts the cleaning liquid pouring nozzle radially outward relative to the center of the substrate.

9. The developing apparatus according to claim 8, wherein the program controls operation of the at least one controller such that the cleaning liquid pouring nozzle stops pouring the cleaning liquid at a position on the substrate at a position that is spaced from a peripheral edge of the substrate in a direction that is towards the center of the substrate and at a predetermined distance from the center of the substrate in a direction that is towards the peripheral edge of the substrate after the nozzle driving mechanism shifts the cleaning liquid pouring nozzle radially outward relative to the center of the substrate at the nozzle moving speed high enough to keep the cleaning liquid pouring position ahead of the margin of the dry area not wetted with the cleaning liquid in the central part of the substrate.

10. The developing apparatus according to claim 8, further comprising an image sensor that provides data on an expanse of the dry area, wherein the program controls operation of the at least one controller based on the data on the expanse of the dry area provided by the image sensor such that the nozzle driving mechanism shifts the cleaning liquid pouring nozzle radially outward relative to the center of the substrate at the nozzle moving speed high enough to keep the cleaning liquid pouring position ahead of the margin of the dry area not wetted with the cleaning liquid in the central part of the substrate.

* * * * *

UNITED STATES PATENT AND TRADEMARK OFFICE
CERTIFICATE OF CORRECTION

PATENT NO. : 7,604,013 B2
APPLICATION NO. : 11/074781
DATED : October 20, 2009
INVENTOR(S) : Nakamura et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 696 days.

Signed and Sealed this

Fourteenth Day of December, 2010

David J. Kappos
*Director of the United States Patent and Trademark Office*